(12) United States Patent
Zang et al.

(10) Patent No.: US 10,622,463 B2
(45) Date of Patent: Apr. 14, 2020

(54) METHOD, APPARATUS AND SYSTEM FOR IMPROVED PERFORMANCE USING TALL FINS IN FINFET DEVICES

(71) Applicant: GLOBALFOUNDRIES INC., Grand Cayman (KY)

(72) Inventors: Hui Zang, Guilderland, NY (US); Min-Hwa Chi, San Jose, CA (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/147,072

(22) Filed: Sep. 28, 2018

(65) Prior Publication Data

US 2019/0043965 A1 Feb. 7, 2019

Related U.S. Application Data

(62) Division of application No. 15/343,821, filed on Nov. 4, 2016, now Pat. No. 10,115,807.

(Continued)

(51) Int. Cl.
*H01L 29/66* (2006.01)
*H01L 21/306* (2006.01)
*H01L 21/8234* (2006.01)
*H01L 21/02* (2006.01)
*H01L 27/088* (2006.01)
(Continued)

(52) U.S. Cl.
CPC .... *H01L 29/66795* (2013.01); *H01L 21/0262* (2013.01); *H01L 21/02532* (2013.01); *H01L 21/02554* (2013.01); *H01L 21/306* (2013.01); *H01L 21/30604* (2013.01); *H01L 21/823431* (2013.01); *H01L 21/823821* (2013.01); *H01L 27/0886* (2013.01); *H01L 27/0924* (2013.01); *H01L 29/0847* (2013.01); *H01L 29/785* (2013.01)

(58) Field of Classification Search
CPC ......... H01L 21/30604; H01L 29/66795; H01L 29/0847
See application file for complete search history.

(56) References Cited

U.S. PATENT DOCUMENTS 5,399,891 A 3/1995 Yiu et al.
9,219,154 B1 * 12/2015 Cheng ................. H01L 29/7853
(Continued)

OTHER PUBLICATIONS

Office Action dated Sep. 22, 2017 from co-pending U.S. Appl. No. 15/343,821.

*Primary Examiner* — Victoria K. Hall
(74) *Attorney, Agent, or Firm* — Williams Morgan, P.C.

(57) ABSTRACT

At least one method, apparatus and system disclosed herein fin field effect transistor (finFET) comprising a tall fin having a plurality of epitaxial regions. A first fin of a transistor is formed. The first fin comprising a first portion comprising silicon, a second portion comprising silicon germanium and a third portion comprising silicon. A gate structure above the third portion is formed. An etching process is performed for removing the silicon germanium of the second portion that is not below the gate structure. A first epitaxy region is formed above the first portion. A second epitaxy region is formed vertically aligned with the first epitaxy region and above the silicon germanium of the second portion that is below the gate structure.

16 Claims, 9 Drawing Sheets

Related U.S. Application Data

(60) Provisional application No. 62/257,189, filed on Nov. 18, 2015.

(51) Int. Cl.
*H01L 29/78* (2006.01)
*H01L 29/08* (2006.01)
*H01L 27/092* (2006.01)
*H01L 21/8238* (2006.01)

(56) References Cited

U.S. PATENT DOCUMENTS

| | | | |
|---|---|---|---|
| 9,985,030 B2 * | 5/2018 | Cheng | H01L 21/823807 |
| 10,249,710 B2 * | 4/2019 | Bentley | H01L 29/0673 |
| 2012/0181599 A1 | 7/2012 | Lung | |
| 2012/0319211 A1 | 12/2012 | van Dal et al. | |
| 2013/0075797 A1 * | 3/2013 | Okano | H01L 29/66795 257/288 |
| 2014/0264485 A1 | 9/2014 | Li et al. | |
| 2015/0137181 A1 * | 5/2015 | Basker | H01L 27/0924 257/192 |
| 2015/0236120 A1 * | 8/2015 | Hashemi | H01L 29/42392 257/9 |
| 2016/0071933 A1 * | 3/2016 | Maitrejean | H01L 29/1054 257/401 |
| 2016/0204263 A1 * | 7/2016 | Mukherjee | H01L 29/42392 257/76 |
| 2016/0225849 A1 * | 8/2016 | Wong | H01L 29/0673 |
| 2017/0005195 A1 * | 1/2017 | Ching | H01L 29/7848 |
| 2017/0104062 A1 * | 4/2017 | Bi | H01L 29/66545 |
| 2017/0133386 A1 * | 5/2017 | Lee | H01L 21/823807 |
| 2017/0140996 A1 | 5/2017 | Lin et al. | |
| 2017/0141112 A1 * | 5/2017 | Ching | H01L 27/0924 |
| 2017/0194213 A1 * | 7/2017 | Ching | H01L 21/823821 |
| 2017/0317169 A1 * | 11/2017 | Bentley | H01L 29/0673 |

\* cited by examiner

METHOD, APPARATUS AND SYSTEM FOR IMPROVED PERFORMANCE USING TALL FINS IN FINFET DEVICES

This application is a divisional of U.S. patent application Ser. No. 15/343,821, filed Nov. 4, 2016, now U.S. Pat. No. 10,115,807, issued Oct. 30, 2018.

BACKGROUND OF THE INVENTION

Field of the Invention

Generally, the present disclosure relates to the manufacture of sophisticated semiconductor devices, and, more specifically, to various methods for fabricating high performance finFET devices.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized cross-sectional depiction of a state-of-the-art FinFET device. A FinFET device 100 illustrated in FIG. 1 comprises a plurality of "fins" 110. The semiconductor device may be positioned in a vertical orientation, creating one or more fins 110. The source and drain of the FinFET are placed horizontally along the fin. A high-k metal gate 120 wraps over the fin, covering it on three sides. The gate 120 defines the length of the FinFET device. The current flow occurs along an orthogonal crystal plane in a direction parallel to the plane of the semiconductor wafer. The electrically significant height of the fin (labeled H) is typically determined by the amount of oxide recess in the fin reveal step and hence is constant for all fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a better packing of the devices per square area resulting in a denser design, or more efficient use of silicon wafer area.

The scaling down of integrated circuits coupled with higher performance requirements for these circuits have prompted an increased interest in finFETs. As such, there is an increased desire to form finFET devices with higher fins. Generally, the higher the fins of a finFET device, the higher the performance of that device. Utilizing taller fins, an increase in drive current may be realized, providing for devices that can operate at faster speed.

One problem exhibited by finFET devices is an uneven distribution of current density, i.e., the so-called current crowding effect. Further, aligning contact formation properly onto source or drain fins of finFET devices can be difficult. As such, designers are turned to forming epitaxy (EPI) layers or formations on fins of finFET devices. However, forming a proper amount of EPI formations on tall fins can be problematic, as illustrated by FIGS. 2-5 below.

FIG. 2 illustrates a stylized, cross-sectional view of a typical set of fins of a finFET device. FIG. 3 illustrates a stylized, cross-sectional view of typical finFET device having EPI formations on its fins. Referring simultaneously to FIGS. 2 and 3, finFET device 200 may be formed using various known processes. A plurality of fins 230 are formed on a silicon layer 210. A silicon oxide layer 220 is formed over the silicon layer 210. The fins 230 have a $1^{st}$ height of "a." FIGS. 2 and 3 show a recess line 240 at the top of the fins 230 after a typical hard mask strip process (e.g., strip of silicon nitride).

As shown in FIG. 3, epitaxy (EPI) growth/formation may be performed to form EPI formations 310 on the fins 230. The EPI formations 310 narrowly avoid contacting each other, but are formed in a diamond shape up to the recess line 240. The recess process reduces the fin height to the recess line 240. However, as noted above, there is a desire in the industry to form finFET devices having taller fins. EPI growth on taller fins may be problematic in state of the art processes, as illustrated below and in FIGS. 4 and 5.

In order to achieve smaller fin pitch, while maintaining sufficient fin area size, designers have turned to forming taller fins. Forming taller fins generally calls for setting the recess line for etching fins at a higher level. FIG. 4 illustrates a stylized, cross-sectional view of a typical set of fins of a finFET device having a higher recess line. FIG. 5 illustrates a stylized, cross-sectional view of typical finFET device having EPI formations on its fins having a higher recess line. Referring simultaneously to FIGS. 4 and 5, a finFET device 400 having a higher recess line is illustrated. A plurality of fins 430 are formed on a silicon layer 410. A silicon oxide layer 420 is formed over the silicon layer 410. The fins 430 have a 1st height of "a."

In order to maintain taller fin specifications (e.g., fin height "a"), the recess line with respect to an etching process is set at a higher level. FIGS. 4 and 5 show a recess line 440 at the top of the fins 430 after a typical hard mask strip process (e.g., strip of silicon nitride). The objective of the higher recess line that is to form taller fins as compared to the fins illustrated in FIG. 3.

As noted above, EPI formations on the fin portions above the oxide layer 420 are desirable. Using traditional epitaxial growth, which is generally implemented to form an EPI layer over the fin portions rising above the oxide layer 420, the diamond shaped EPI layers 510 become too large. As illustrated in FIG. 5, the EPI layers 510 tend to overlap each other due to the growth of the EPI layer over the span of the fin portions rising above the oxide layer 420.

The overlapping of the EPI formations 510 (merged fins) may cause various problems in the final manufactured IC devices. For example, the overlapping of the EPI formations 510 causes the devices 400 to become irregular. This may result in transistors that operate inconsistently. Transistors or other IC devices manufactured from semiconductor wafers having these overlapping EPI formations 510 may operate inconsistently from devices manufactured from another semiconductor wafer having similar EPI formations 510. Further, the overlapping of the EPI formations 510 may cause the processing of semiconductor wafers to become more uncontrollable, leading to various design violations. This can cause various problems in the manufacturing of IC devices.

Moreover, in memory devices, e.g., SRAMs, the fins 410 may represent N-fins and p-fins, which may be formed consecutively. In this case, the overlapping of the EPI formations 510 would cause shorting of the device 400. Thus, memory devices having the EPI formations 510 of FIG. 5 can cause various shorts, leading to device errors.

Designers have attempted to at least partially alleviate these concerns by forming narrower EPI formations on taller fins, as illustrated by FIGS. 6 and 7. FIG. 6 illustrates a stylized, cross-sectional depiction of a typical finFET device having an EPI growth. FIG. 7 illustrates a stylized, cross-sectional depiction of a typical finFET device having an elliptical EPI growth.

Referring simultaneously to FIGS. 6 and 7, a transistor 600 has a plurality of fins 630. The fins 630 are formed on a silicon layer 610. A silicon oxide layer 620 is formed over the silicon layer 610. As shown in FIGS. 6, EPI growth/formation may be performed to form EPI formations 640 on the fins 630. The EPI formations 640 are formed in a diamond shape starting atop the silicon oxide layer 620.

In order to form narrower EPI formations, designers resort to employing different growth rates on different planes of EPI formations. During the epitaxy growth process, etching gas (e.g., HCl gas) may be added to the process gas to selectively grow EPI structures. That is, epitaxial growth of the epitaxy layer 640 may be halted to introduce etching gas. Therefore, epitaxial growth and the etching of a portion of the epitaxy layer 640 may be performed in the same chamber with no intervening vacuum break. This process provides resulting elliptical EPI structures 710 (FIG. 7), which are narrower than the EPI structures of FIG. 6. One such elliptical EPI structure is described in U.S. Patent App. No. 2011/0210404. However, this process calls for more complex manufacturing processes, which increases the cost of manufacturing. Further, this process requires longer EPI deposition time, which also causes manufacturing complexities, delays, and costs.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a fin field effect transistor (finFET) comprising a tall fin having a plurality of epitaxial regions. A first fin of a transistor is formed. The first fin comprising a first portion comprising silicon, a second portion comprising silicon germanium and a third portion comprising silicon. A gate structure above the third portion is formed. An etching process is performed for removing the silicon germanium of the second portion that is not below the gate structure. A first epitaxy region is formed above the first portion. A second epitaxy region is formed vertically aligned with the first epitaxy region and above the second region.

BRIEF DESCRIPTION OF THE DRAWINGS

The disclosure may be understood by reference to the following description taken in conjunction with the accompanying drawings, in which like reference numerals identify like elements, and in which.

Figure 1:
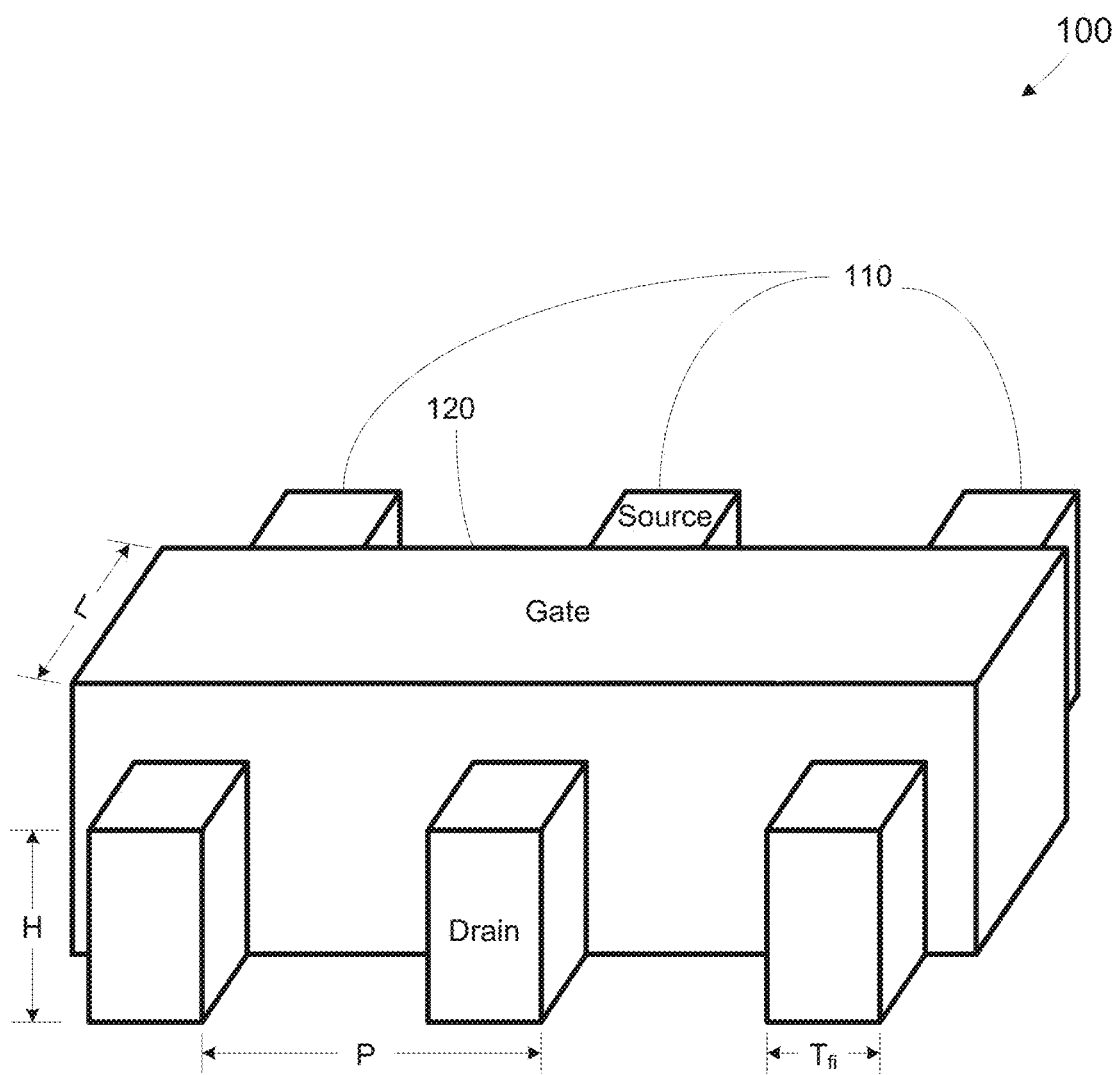
FIG. 1 illustrates a stylized cross-sectional depiction of a state-of-the-art FinFET device.
Figure 2:
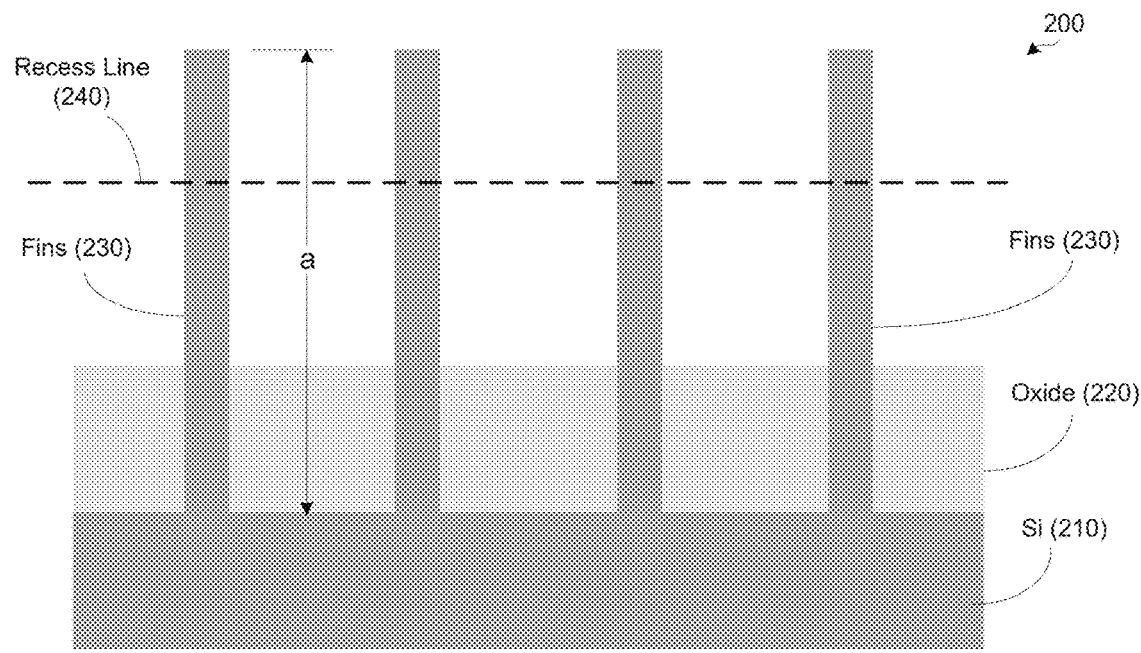
FIG. 2 illustrates a stylized, cross-sectional view of a typical set of fins of a finFET device.
Figure 3:
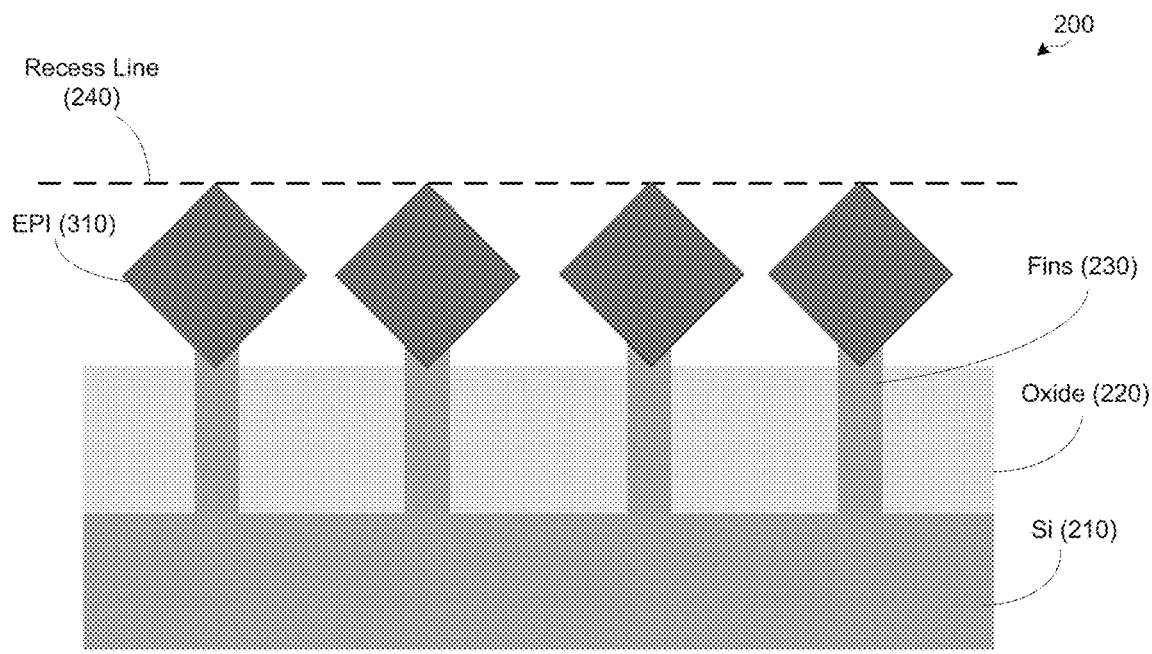
FIG. 3 illustrates a stylized, cross-sectional view of typical finFET device having EPI formations on its fins.
Figure 4:
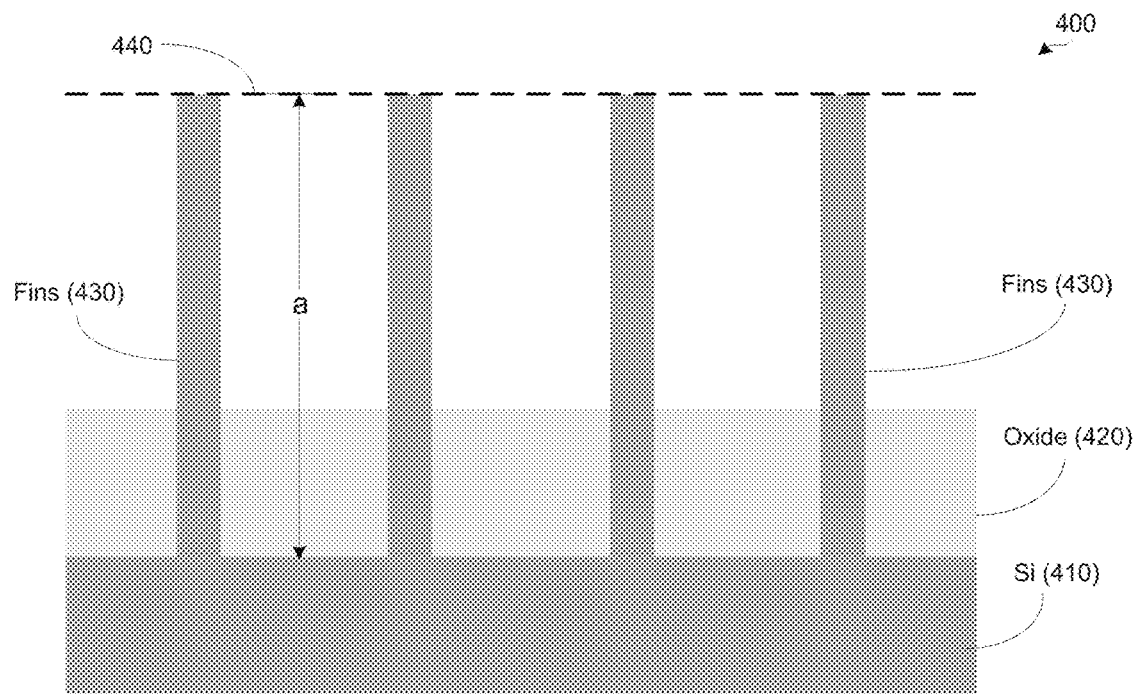
FIG. 4 illustrates a stylized, cross-sectional view of a typical set of fins of a finFET device having a higher recess line.
Figure 5:
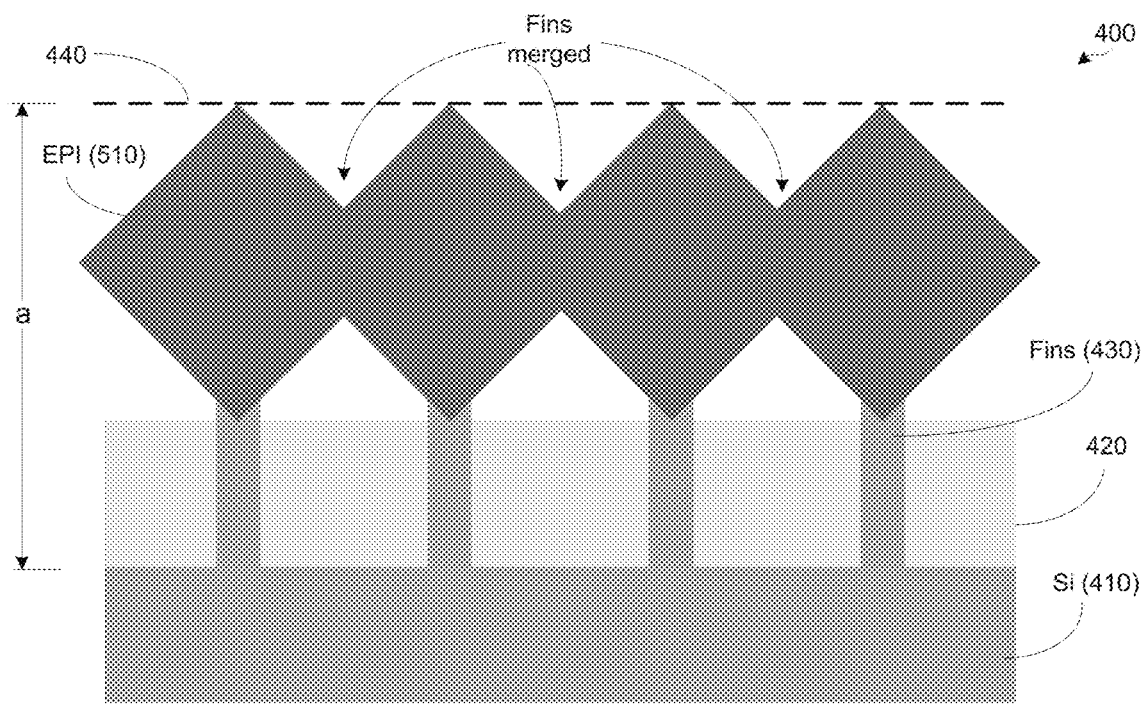
FIG. 5 illustrates a stylized, cross-sectional view of typical finFET device having EPI formations on its fins having a higher recess line.
Figure 6:
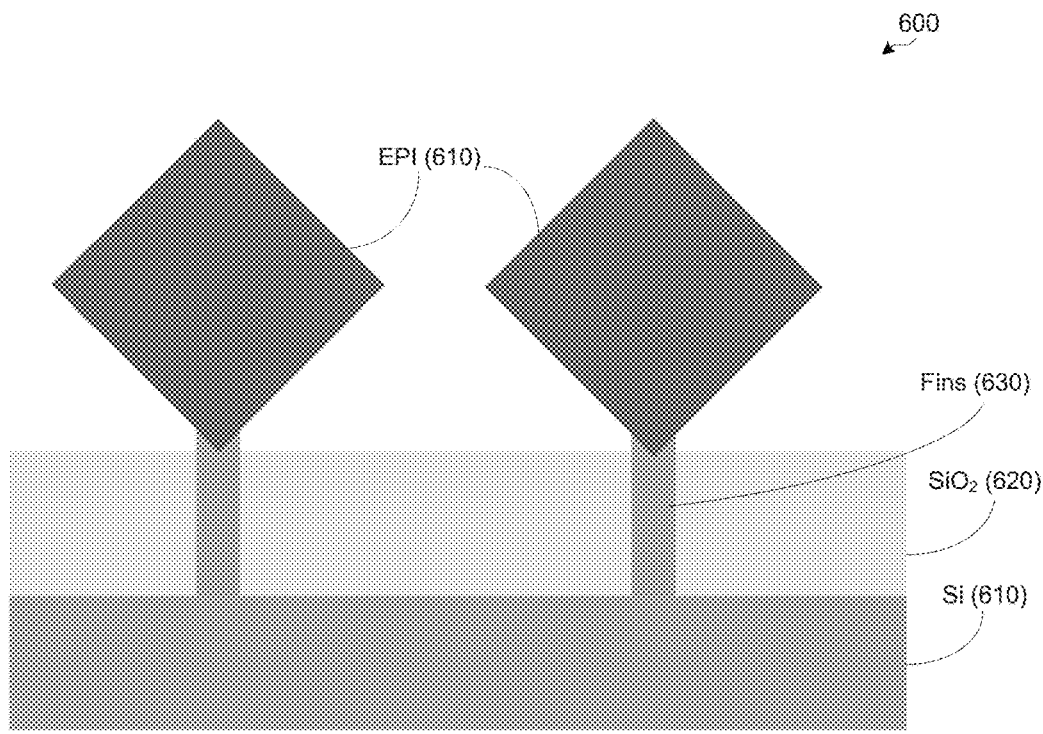
FIG. 6 illustrates a stylized, cross-sectional depiction of a typical finFET device having an EPI growth.
Figure 7:
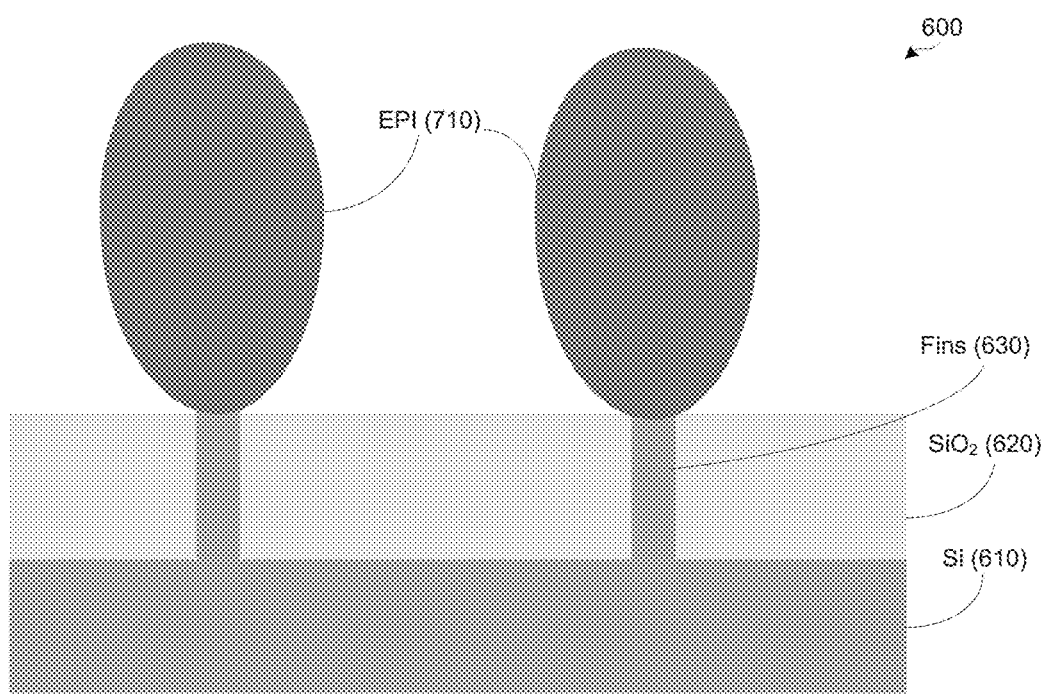
FIG. 7 illustrates a stylized, cross-sectional depiction of a typical finFET device having an elliptical EPI growth.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for increasing at least a portion of an active area of fins in a finFET device. Embodiments herein provide for increasing the active area with respect to the vertical dimensions of the fins while controlling and attenuating the lateral dimensions of the fins. Accordingly, embodiments herein provide for increased performance of finFETs (e.g., increase in drive current by providing epitaxial (EPI) growth in the vertical dimension for taller fins while preventing excessive EPI growth in the lateral dimension. This may provide for preventing inconsistent manufacturing results and/or preventing short circuiting P-type fins with adjacent N-type fins in memory devices. Using embodiments herein, finFET devices comprising small pitch fins may be developed, while using tall fins for sufficient fin area. Further, using embodiments herein, sufficient EPI regions on the tall fins may be formed without the EPI regions contacting other EPI regions of adjacent fins.

Figure 8:
FIG. 8 illustrates a stylized cross-sectional view of an finFET device along its fins, in accordance with embodiments herein.

FIG. 8 illustrates a stylized cross-sectional view of a finFET device along its fins, in accordance with embodiments herein. A $1^{st}$ silicon (Si) layer 810 is formed on a device 800. In one embodiment, the Si layer 810 may be part of the substrate of a semiconductor wafer. A silicon germanium (SiGe) layer 820 is formed above the $1^{st}$ Si layer 815 portion of the fin 930. In an alternative embodiment, the SiGe layer 820 may be formed by forming a sacrificial oxide layer and subsequently generating the SiGe layer 820.

The SiGe layer 820 is formed such that an EPI structure may be formed on the SiGe layer 820. In one embodiment, the SiGe layer 820 may be about 15 nm thick. Subsequently, a $2^{nd}$ Si layer 830 is formed above the SiGe layer 820. The $2^{nd}$ Si layer 830 is formed such that another EPI structure may be formed on the $2^{nd}$ Si layer 830. In one embodiment, the $2^{nd}$ Si layer 830 may be about 15 nm to 20 nm thick. Although these deposition steps may be repeated, for ease of illustration, only one SiGe layer 820 is illustrated. However, those skilled in the art having benefit of the present disclosure would appreciate that a plurality of layers of SiGe/Si layer combinations may be formed.

Figure 9:
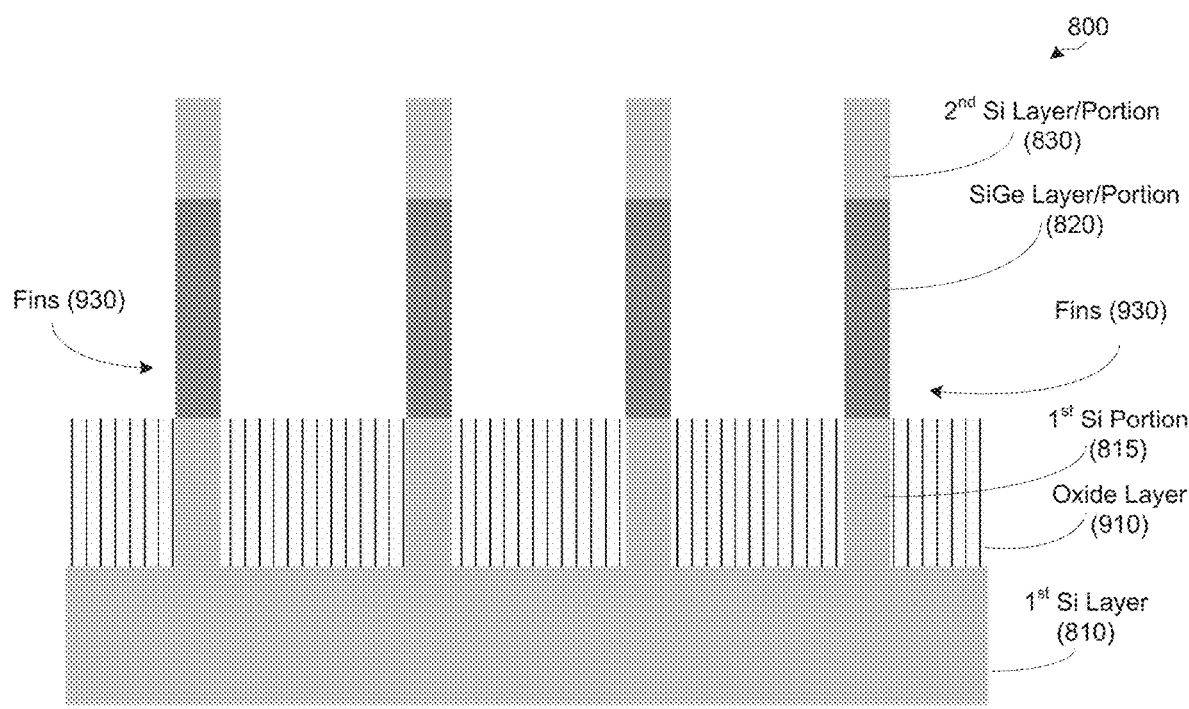
FIG. 9 illustrates a stylized cross-sectional view of the finFET device of FIG. 8 across its fins, in accordance with embodiments herein.

FIG. 9 illustrates a stylized cross-sectional view of the finFET device 800 across its fins, in accordance with embodiments herein. A recess process may be performed to form a plurality of fins 930 (e.g., source/drain fins for a finFET device). The fins 930 comprise the $1^{st}$ Si portion 815, the SiGe layer 820, and the $2^{nd}$ Si portion 830.

In one embodiment, the recess process may be performed using a dry etch process, such as a reactive-ion etching (RIE) process. In another embodiment, the recess process may be performed using a wet etch process, such as using hydrofluoric acid (HF) chemical etching. In yet another embodiment, the recess process may comprise a combination of dry etching and wet etching processes. The recess amount is greater for the fins 930 as compared to normal recess amounts since the fins 930 are taller than normal fins. In one embodiment, this process is performed in an un-doped state (i.e., prior to performing doping).

Further, as shown in FIG. 9, a deposition process for depositing an oxide material 910 (e.g., silicon oxide) is performed. In one embodiment, the oxide material layer 910 may be about 2-3 nm thick. The deposition of the material 910 may be accomplished on the basis of well-established deposition techniques, such as plasma enhanced chemical vapor deposition (CVD), thermally activated CVD, spin-on techniques, depending on the material characteristics required.

In one embodiment, upon deposition of the SiGe layer 820 and the $2^{nd}$ Si layer 830, various known fin formation processing steps may be performed. For example, deposition of hard mask layers may be performed. Further, mandrel pattern processing may be performed, followed by etch processing. Subsequently, a mandrel removal process followed by a hard mask etching processing may be performed. This process may be followed by a spacer removal process.

The etching processes described herein may be performed using a dry etch process, such as a reactive-ion etching (RIE) process. In other embodiments, the etching processes may be performed using a wet etch process, such as using hydrofluoric acid (HF) chemical etching. In yet another embodiment, the etching processes may comprise a combination of dry etching and wet etching processes.

Further, shallow trench isolation (STI) layer processing, and fin reveal processing may be performed. For example, an Si-etching processing may be performed and an oxide gap-fill process to provide the oxide layer 910 may be performed. Subsequently, a chemical-mechanical polishing (CMP) processing may be performed, followed by an annealing process (e.g., rapid-thermal anneal) may be performed. An oxide etching process may be performed to reveal the fins 930, by etching the oxide to the level shown in FIG. 9.

Further, an N-well and P-well formation process may be performed. This process may include N-well and P-well a patterning process and doping processes (implanting n-dopant and p-dopant). Further an annealing process may be performed.

Figure 10:
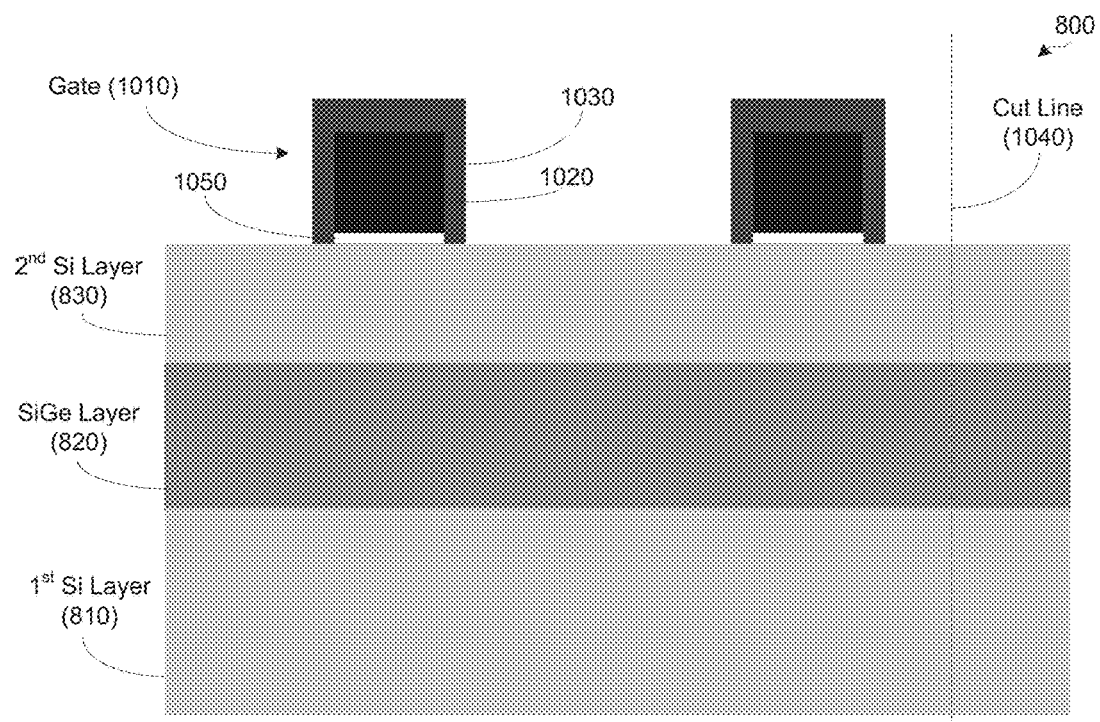
FIG. 10 illustrates a stylized cross-sectional view of the finFET device of FIG. 8, along its fins with regard to a gate formation process, in accordance with embodiments herein.

FIG. 10 illustrates a stylized cross-sectional view of the finFET device 800 along its fins with regard to a gate formation process, in accordance with embodiments herein. A PC-gate and spacer formation process may be performed. Gate formations 1010 may be formed on the device 800. The gate formation 1010 may be positioned above a channel region.

A dielectric region may be etched into the fins 930 and a dielectric material 1050 (e.g., SiO$_2$) may be deposited. A polysilicon layer 1020 may be deposited and patterned. Subsequently, a spacer formation process may be performed to form a spacer structure 1030, which may be comprised of any appropriate material such as silicon nitride, silicon dioxide and the like.

The spacer structure 1030 may be formed on the basis of well-established deposition and etch techniques, wherein a width of the spacer structure 1030 may be selected in accordance with a desired dopant profile in each of the end portions of the fins 930. That is, moderately high dopant concentration may be established in the end portions adjacent to the gate electrode structure 1010, possibly by using an offset spacer element (not shown). Thereafter one or more spacer elements may be provided and may be used as an implantation mask during one or more subsequent implantation steps to provide the desired high dopant concentration in the end portions. It should be appreciated that any appropriate concentration profile extending from the electrode material 1010 may be established by appropriately forming a corresponding number of spacer elements in the structure 1030. It should further be appreciated that any other implantation processes may be performed.

Figure 11:
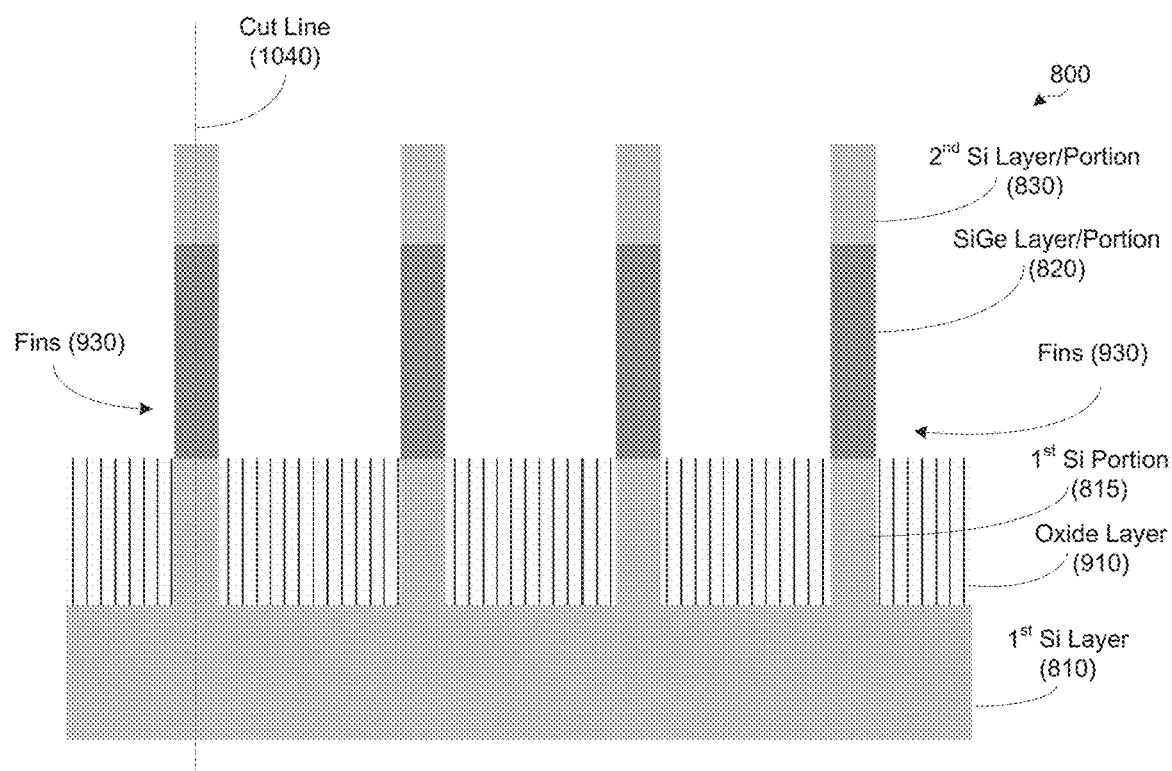
FIG. 11 illustrates a stylized cross-sectional view of S/D fins having the various layers with reference to the dotted line of FIG. 10, in accordance with embodiments herein.

Further, halo implant processes may be performed. This process may be performed selectively for N/P regions, certain core regions, SRAM devices, and/or input/output (I/O) areas. Further, a blank SiGe wet etching processing may be performed. Subsequently, doping processes may be performed. For example, eSiGe with in-situ or P+ implant doping process may be performed for P-type source-drain fins. An Si-epi process with in-situ or N+ implant doping may be performed for N-type raised source-drain fins. FIG. 10 also shows a dotted line 1040 for a cross-sectional view at the S/D fins 930, which is shown in FIG. 11. FIG. 11 illustrates a stylized cross-sectional view of the S/D fins 930 having the various layers (SiGe layer 820 and Si layer 830) with reference to the dotted line 1040.

Figure 12:
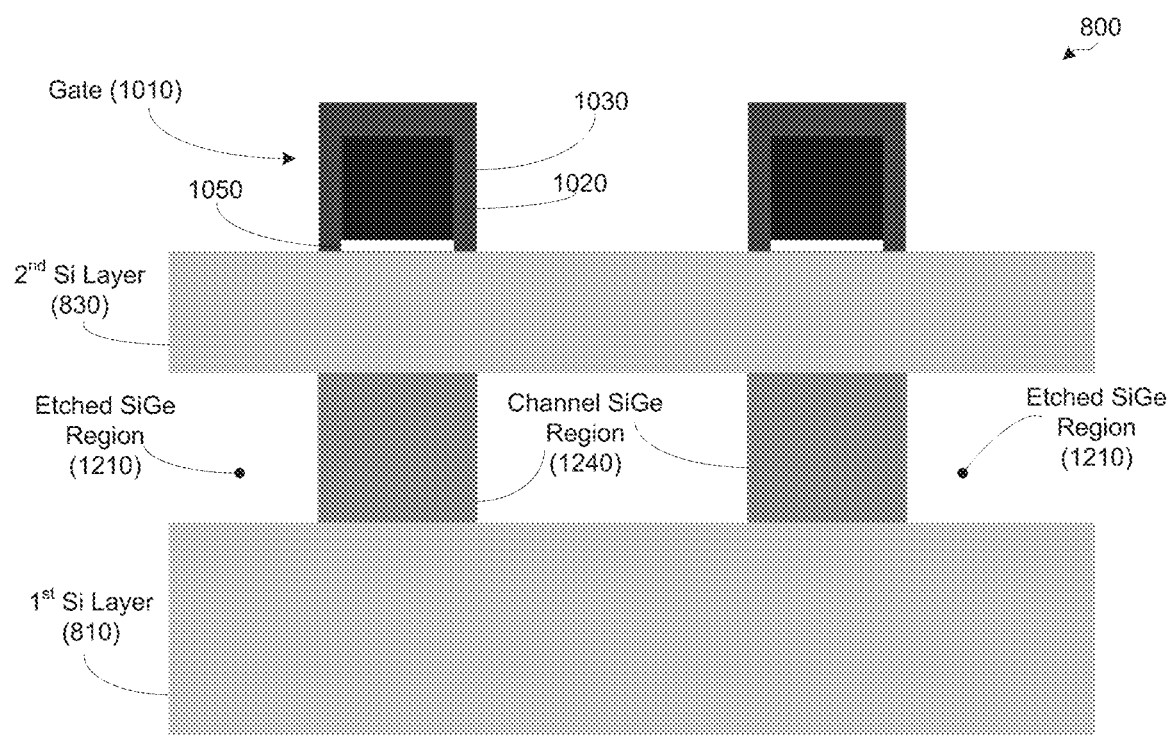
FIG. 12 illustrates a stylized cross-sectional view of the finFET device of FIG. 8 further along in processing, in accordance with embodiments herein.

FIG. 12 illustrates a stylized cross-sectional view of the finFET device 800 further along in processing, in accordance with embodiments herein. A wet SiGe etching may be performed to etch the SiGe layer 820 of the device 800. This etching process performed on the SiGe layer 820 may provide for a faster etching rate as compared to the etching rate of the Si region 830. Upon performing the wet SiGe etching process, regions 1210 where the SiGe layer 820 was partially removed, are the source/drain regions. As shown in FIG. 12, channel SiGe regions 1240 of the SiGe layer 820 remain under the gate regions 1010, since those portions were not etched away. That is, the SiGe layer 820 in the channel regions (i.e., channel SiGe regions 1240) are preserved.

Figure 13:
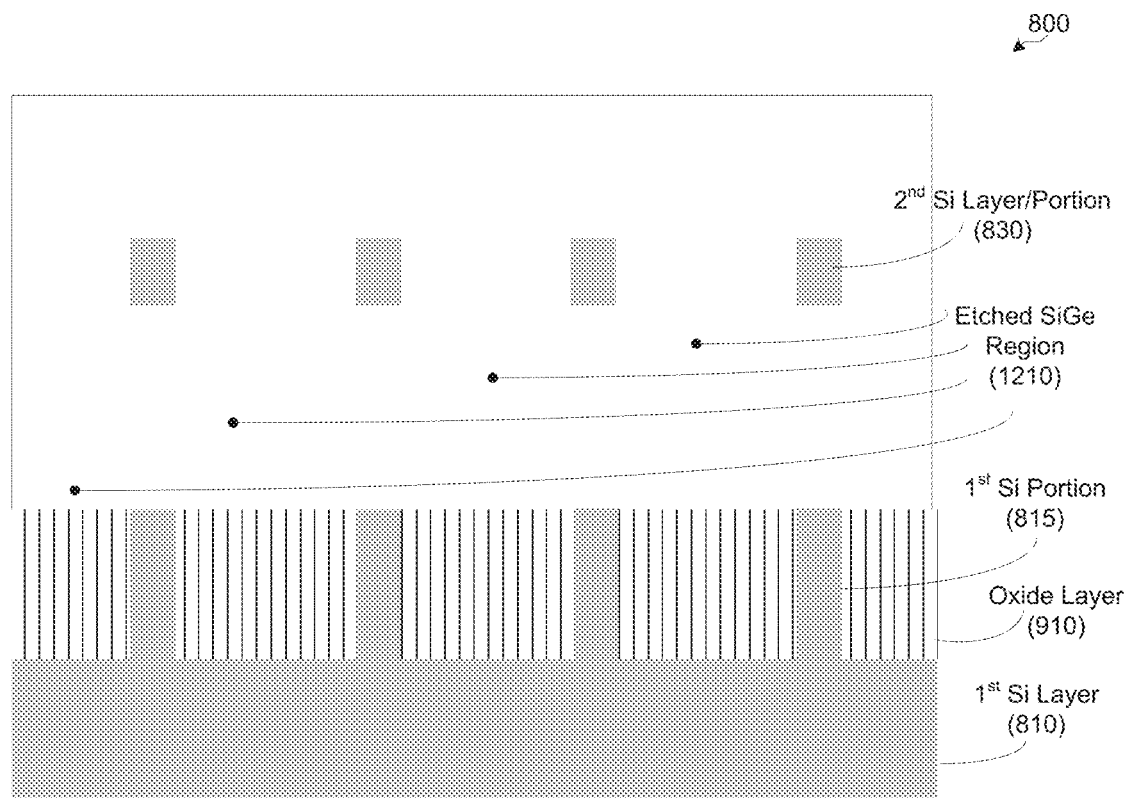
FIG. 13 illustrates a stylized cross-sectional view of the finFET device of FIG. 8 further along in processing after the SiGe etching process of FIG. 12, in accordance with embodiments herein.

FIG. 13 illustrates a stylized cross-sectional view of the finFET device 800 further along in processing after the SiGe etching process of FIG. 12, in accordance with embodiments herein. FIG. 13 shows that aside from the portion below the gate structures 1010, the SiGe layer 820 has been removed, while the $2^{nd}$ Si layers 830 remain. Although the $2^{nd}$ Si layers 830 appear to be floating, those skilled in the art would appreciate that the $2^{nd}$ Si layers 830 are supported by the gate structures 1010.

Subsequently, carrier generation/implantation processes may be performed to facilitate EPI growth. For P-type source/drain fins, a TJ epitaxial growth/doping process is performed. For N-type source/drain fins, an RG epitaxial growth/doping process is performed.

Figure 14:
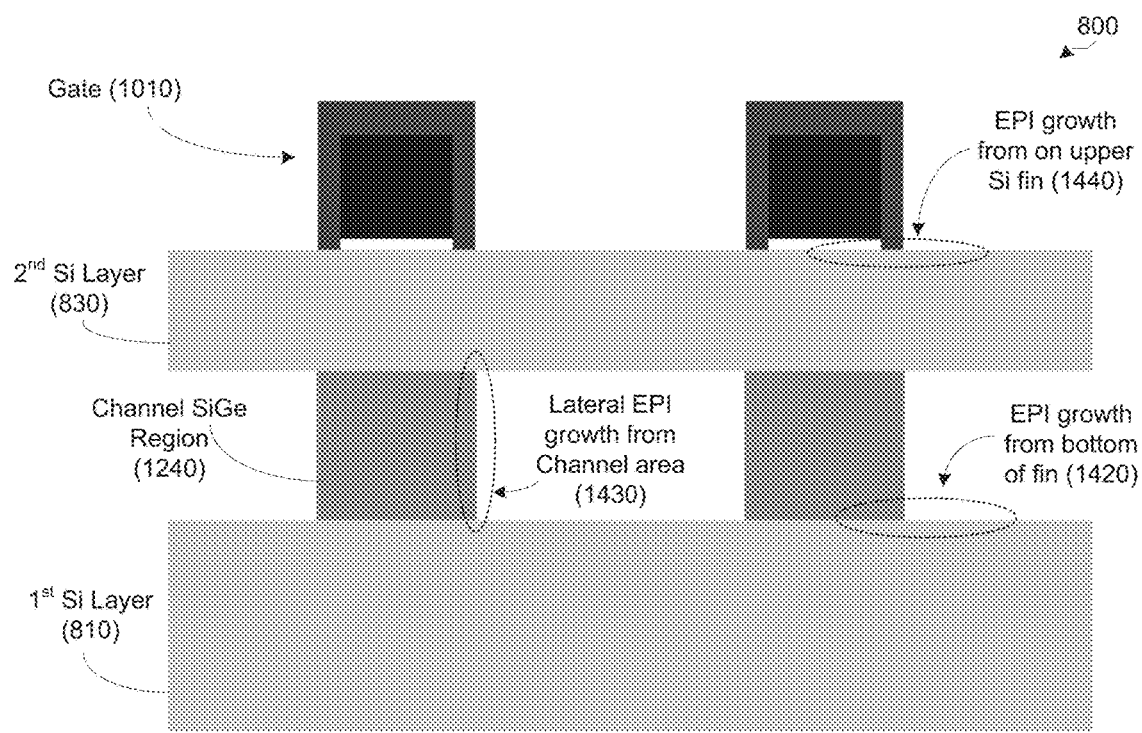
FIG. 14 illustrates a stylized, cross-sectional view of the finFET device of FIG. 8 further along in processing with regard to EPI growth, in accordance with embodiments herein.

FIG. 14 illustrates a stylized, cross-sectional view of the finFET device 800 further along in processing with regard to EPI growth, in accordance with embodiments herein. FIG. 14 shows the gate structures 1010 above the $2^{nd}$ Si layer 830, and channel SiGe regions 1240 (i.e., the remaining SiGe formations in the channel region).

As shown in FIG. 14, the $2^{nd}$ Si layer 830 and the channel SiGe region 1240 serve as channels for the finFET device 800. With regard to an N-channel finFET device, the threshold voltage (Vt) is approximately the same because the conduction band edge of SiGe is approximately the same as the conduction band edge of Si. The bandgap between the conduction band and the valance band of silicon is 1.12 eV, while the bandgap between the conduction band and the valance band of germanium is 0.66 eV. Therefore, the bandgap between the conduction band and the valance band of silicon germanium is between 1.12 eV and 0.66 eV, depending on the concentration of silicon and germanium in the SiGe material. The bandgap of SiGe is smaller than the bandgap of Si primarily due to the valance band edge shift, which is about 5-7 mV per percentage of Ge. However, the shift in its conduction band is substantially negligible.

With regard to a P-channel finFET device, only the SiGe channel is effective, as the valance band edge is shifted toward the mid-gap more that the valance band edge of Si. Thus, the SiGe channel, which has better mobility, has a lower a threshold voltage (Vt) than the Si channel as pFET.

Upon initiation of the EPI growth/doping process, EPI growth takes place from region 1420. In other words, EPI growth takes place on the bottom portion of the fin, into a diamond shape. Further, from region 1430, adjacent the channel SiGe region 1240, EPI structure grows laterally, forming a diamond shape. From region 1440, the EPI growth takes place on the upper, $2^{nd}$ Si region 830. The EPI growth in region 1440 also grows into a diamond shape. However, due to the multi-layered fins 930, the EPI growth from region 1420 is limited by the obstruction of the $2^{nd}$ Si layer 830. As such, lateral EPI growths in the in the finFET device 800 are limited. Therefore, two sets of EPI growth, one above the other, in a diamond shapes are formed on each fin 930.

Figure 15:
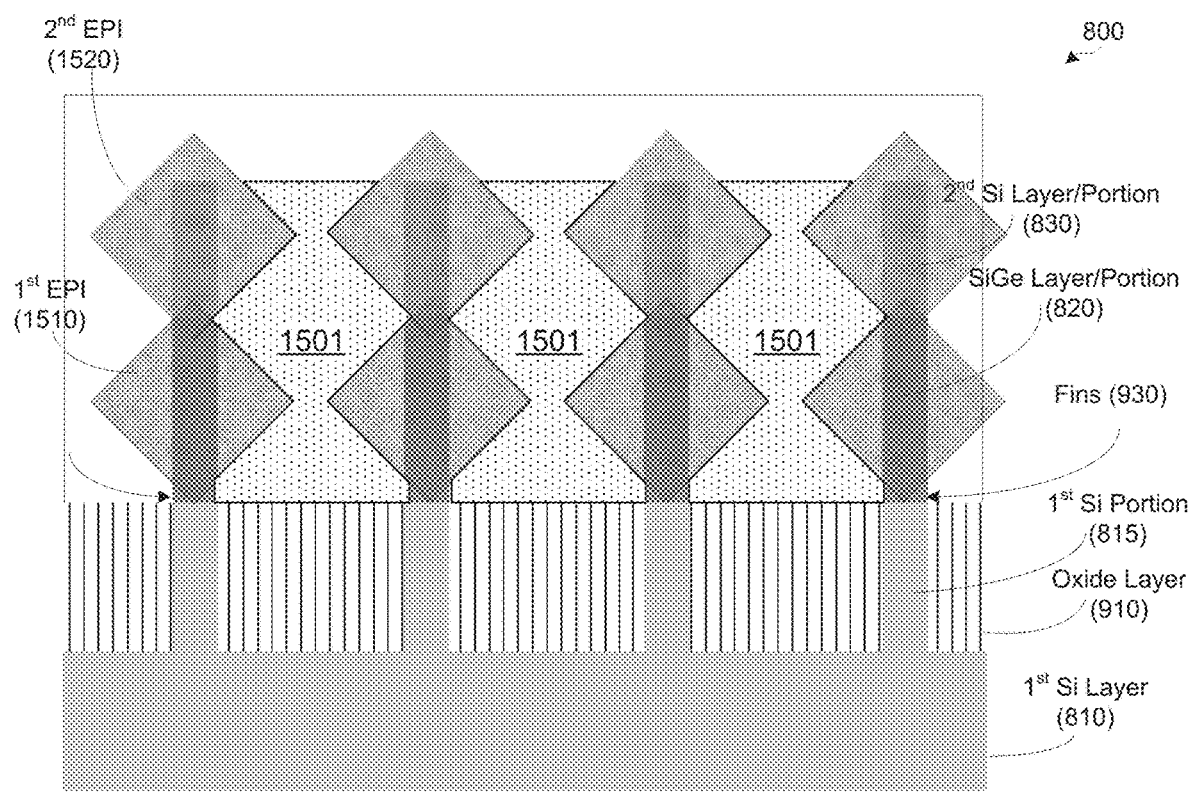
FIG. 15 illustrates a stylized, cross-sectional view of the finFET device of FIG. 8 further after EPI growth, in accordance with embodiments herein.

FIG. 15 illustrates a stylized, cross-sectional view of the finFET device 800 further along processing, after EPI growth, in accordance with embodiments herein. FIG. 15 illustrates that a $1^{st}$ EPI structure 1510 is formed on each fin 930 between the oxide layer 910 and the $2^{nd}$ Si layer 830. A $2^{nd}$ EPI structure 1520 is formed on each fin 930 above the $2^{nd}$ Si layer 830. Therefore, each fin 930 comprises two vertically-aligned EPI structures 1510, 1520. In one embodiment, the EPI structures 1510, 1520 are grown until the diamond shapes of the EPI structures 1510, 1520 are merged vertically. In this manner, finFET devices comprising small pitch fins may be formed, while providing taller fins for sufficient fin area. Further, using embodiments herein, tall fins may be formed in small pitch finFET devices, while providing sufficient EPI regions for high resistivity and/or improved contact areas.

In some embodiment, the two EPI structures 1510, 1520 may be formed using a reduced pressure CVD (RPCVD), ultra-high vacuum CVD (UHVCVD), metal organic CVD (MOCVD). In some embodiments, the two EPI structures 1510, 1520 may be formed using a precursor material, such as $SiH_4$ gas, $Si_2H_4Cl_2$ gas, $Si_2H_6$ gas, $Si_3H_8$ gas, or $GeH_4$ gas. In some embodiments the EPI structures 1510, 1520 may comprise silicon germanium, silicon carbon, or silicon phosphate.

The finFET structure shown in FIG. 15 provides for tall fins with EPI regions are laterally limited in dimension such that EPI regions do not come into contact with EPI regions of adjacent fins. This provides for controllable manufacturing processes and prevention of short circuiting between adjacent N-type and P-type fins (e.g., in SRAM devices).

In one embodiment, the required performance (e.g., drive current) of the finFET device 800 may be used to determine the height and width of the fins 930. The width of the two EPI structures 1510, 1520 may be proportional to the width of the fins and/or the distance between the fins 930. The lateral dimensions of the two EPI structures 1510, 1520 are determined such that EPI structures from adjacent fins do not come into contact with two EPI structures 1510, 1520.

In some embodiments, a metal layer 1501 (e.g., tungsten) may be filled in between the fins 930. The sidewall of each fin 930 then also becomes a contact area, which provides for longer/larger contact areas. This provides for maximum sidewall S/D area. That is, a maximum contact area is provided for low resistivity, which is a desirable feature of finFET deices with tall fin height.

Subsequent processing may then be performed to form the finFET device with tall fins. For example, replacement gate (RMG) formation processes may be performed. This process may include ILD deposition, CMP processes, poly exposure, poly removal, high-k deposition, and work-function metal deposition processes, which may be performed selectively for N-FET devices and P-FET devices. Subsequently, gate metal filling processes may be performed. The metal gates may comprise Ti, TiN, TiAlC, and/or W materials.

Further, silicide and contact formation process (MOL) may be performed. This process may include trench silicide (TS) patterning, TS etch process, PR removal process, nitride (N) deposition process, Ni-Si formation, contact pattering, and W-filling processes. Subsequently, the processing of the finFET devices may be continued with back end of line (BEOL) interconnection processes.

Figure 16:
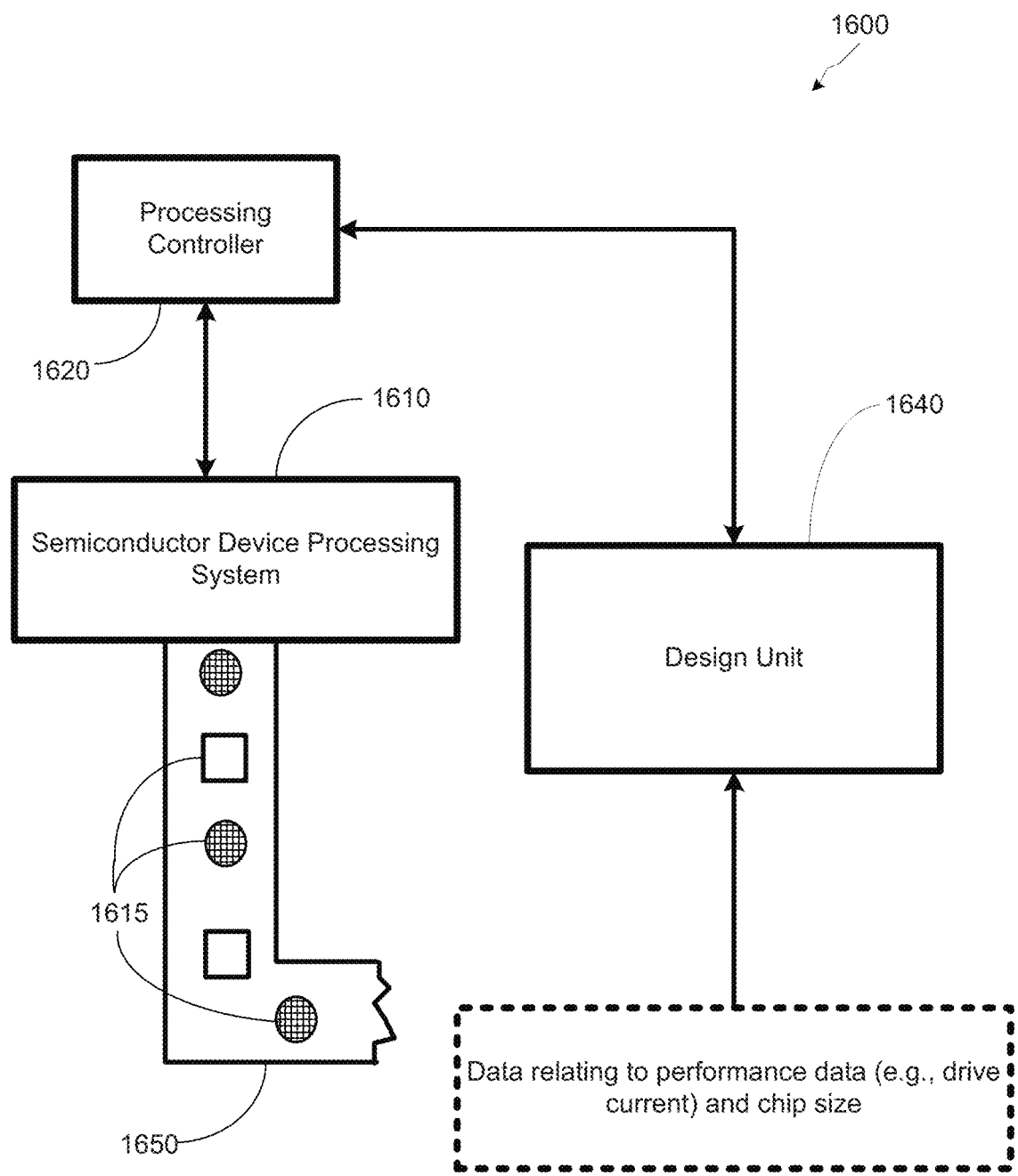
FIG. 16 illustrates a stylized depiction of a system for fabricating a finFET comprising tall fins having epitaxy regions, in accordance with embodiments herein.

Turning now to FIG. 16, a stylized depiction of a system for fabricating a semiconductor device package comprising a topside interconnection substrate, in accordance with embodiments herein, is illustrated. The system 1600 of FIG. 16 may comprise a semiconductor device processing system 1610 and a design unit 1640. The semiconductor device processing system 1610 may manufacture integrated circuit devices based upon one or more designs provided by the design unit 1640.

The semiconductor device processing system 1610 may comprise various processing stations, such as etch process stations, photolithography process stations, CMP process stations, etc. One or more of the processing steps performed by the processing system 1610 may be controlled by the processing controller 1620. The processing controller 1620 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1610 may produce integrated circuits on a medium, such as silicon wafers. More particularly, the semiconductor device processing system 1610 produce integrated circuits having finFET devices that comprise tall fins, as described above.

The production of integrated circuits by the device processing system 1610 may be based upon the circuit designs provided by the integrated circuits design unit 1640. The processing system 1610 may provide processed integrated circuits/devices 1615 on a transport mechanism 1650, such as a conveyor system. In some embodiments, the conveyor system may be sophisticated clean room transport systems that are capable of transporting semiconductor wafers. In one embodiment, the semiconductor device processing system 1610 may comprise a plurality of processing steps, e.g., the $1^{st}$ process step, the $2^{nd}$ process step, etc., as described above.

In some embodiments, the items labeled "1615" may represent individual wafers, and in other embodiments, the items 1615 may represent a group of semiconductor wafers, e.g., a "lot" of semiconductor wafers. The integrated circuit or device 1615 may be a transistor, a capacitor, a resistor, a memory cell, a processor, and/or the like. In one embodiment, the device 1615 is a transistor and the dielectric layer is a gate insulation layer for the transistor.

The integrated circuit design unit 1640 of the system 1600 is capable of providing a circuit design that may be manufactured by the semiconductor processing system 1610. The integrated circuit design unit 1640 may be capable of determining the number of devices (e.g., processors, memory devices, etc.) to place in a device package. The integrated circuit design unit 1640 may also determine the height of the fins, the size of the EPI formation on the fins, etc. These dimensions may be based upon data relating to drive currents/performance metrics, device dimensions, etc. Based upon such details of the devices, the integrated circuit design unit 1640 may determine specifications of the finFETs that are to be manufactured. Based upon these specifications, the integrated circuit design unit 1640 may provide data for manufacturing a semiconductor device package described herein.

The system 1600 may be capable of performing analysis and manufacturing of various products involving various technologies. For example, the system 1600 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A fin field effect transistor (finFET) comprising:
   a first fin extending upward from a substrate to a first height, wherein said first fin comprises a first portion comprising a silicon layer, a second portion comprising silicon germanium, and a third portion comprising silicon;
   a first epitaxy region above said first portion, wherein the first epitaxy region has a maximum lateral extent at a height between a top and a bottom of the second portion; and
   a second epitaxy region vertically aligned with said first epitaxy region and above said second portion, wherein the second epitaxy region has a maximum lateral extent at a height between a top and a bottom of the third portion.

2. The finFET of claim 1, further comprising a second fin comprising a first portion comprising silicon, a second portion comprising silicon germanium, and a third portion comprising silicon, wherein said second fin is a first distance away from said first fin and wherein said second fin comprises a first epitaxy region above said first portion, and a second epitaxy region vertically aligned with said first epitaxy region and above said second portion of the second fin.

3. The finFET of claim 2, wherein a space between said first and second fins comprises an oxide material deposited up to the height of said first portions of said first and second fins.

4. The finFET of claim 2, wherein the maximum lateral extent of said first and second epitaxy regions of said first and second fins are less than said first distance such that said first and second epitaxial regions of said first fin do not contact said first and second epitaxial regions of said second fin.

5. The finFET of claim 2, wherein said first and second fins are gate fins, and wherein a top portion of said first epitaxy region is in contact with a bottom portion of said second epitaxy region.

6. The finFET of claim 2, further comprising a metal layer filled in between the first and second fins.

7. A fin field effect transistor (finFET) comprising:
   a first fin extending upward from a substrate to a first height, wherein said first fin comprises a first portion comprising silicon layer, a second portion comprising silicon germanium, and a third portion comprising silicon; gate structures above the third portion, wherein the second portion is present only directly under the gate structures;
   a first epitaxy region above said first portion, wherein the first epitaxy region has a maximum lateral extent at a height between a top and a bottom of the second portion; and
   a second epitaxy region vertically aligned with said first epitaxy region and above said second portion, wherein the second epitaxy region has a maximum lateral extent at a height between a top and a bottom of the third portion.

8. The finFET of claim 7, further comprising a second fin comprising a first portion comprising silicon, a second portion comprising silicon germanium, and a third portion comprising silicon; gate structures above the third portion, wherein the second portion is present only directly under the gate structures; wherein said second fin is a first distance away from said first fin and wherein said second fin further comprises a first epitaxy region above said first portion, and a second epitaxy region vertically aligned with said first epitaxy region and above said second portion of the second fin.

9. The finFET of claim 8, wherein a space between said first and second fins comprises an oxide material deposited up to the height of said first portions of said first and second fins.

10. The finFET of claim 8, wherein the maximum lateral extent of said first and second epitaxy regions of said first and second fins are less than said first distance such that said first and second epitaxial regions of said first fin do not contact said first and second epitaxial regions of said second fin.

11. The finFET of claim 8, wherein said first and second fins are gate fins, and wherein a top portion of said first epitaxy region is in contact with a bottom portion of said second epitaxy region.

12. The finFET of claim 8, further comprising a metal layer filled in between the first and second fins.

13. A fin field effect transistor (finFET) comprising:
   a first fin extending upward from a substrate to a first height, wherein said first fin comprises a first portion comprising silicon layer, a second portion comprising silicon germanium, and a third portion comprising silicon;
   a first epitaxy region above said first portion of said first fin, wherein the first epitaxy region has a maximum lateral extent at a height between a top and a bottom of the second portion;
   a second epitaxy region vertically aligned with said first epitaxy region and above said second portion of said first fin, wherein the second epitaxy region has a maximum lateral extent at a height between a top and a bottom of the third portion;
   a second fin comprising a first portion comprising silicon, a second portion comprising silicon germanium, and a third portion comprising silicon, wherein said second fin is a first distance away from said first fin;
   a third epitaxy region above said first portion of said second fin; and
   a fourth epitaxy region vertically aligned with said first epitaxy region and above said second portion of the second fin;
   wherein said first epitaxy region is in contact with said second epitaxy region, said third epitaxy region is in contact with said fourth epitaxy region, said first epitaxy region is not in contact with said third epitaxy region or said fourth epitaxy region, and said second epitaxy region is not in contact with said third epitaxy region or said fourth epitaxy region.

14. The finFET of claim 13, wherein a space between said first and second fins comprises an oxide material deposited up to the height of said first portions of said first and second fins.

15. The finFET of claim 13, further comprising a gate structure above each of the first fin and the second fin.

16. The finFET of claim 13, further comprising a metal layer filled in between the first and second fins.

* * * * *